US012751089B2

(12) United States Patent
Cao et al.

(10) Patent No.: US 12,751,089 B2
(45) Date of Patent: Sep. 29, 2026

(54) ARRAY SUBSTRATE, DISPLAY PANEL AND DISPLAY DEVICE

(71) Applicant: WUHAN CHINA STAR OPTOELECTRONICS TECHNOLOGY CO., LTD., Hubei (CN)

(72) Inventors: Haiming Cao, Wuhan (CN); Chao Tian, Wuhan (CN); Shiyu Long, Wuhan (CN); Chunpeng Zhang, Wuhan (CN); Fei Ai, Wuhan (CN); Chungching Hsieh, Wuhan (CN); Jianfeng Yuan, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 277 days.

(21) Appl. No.: 18/567,221

(22) PCT Filed: Sep. 26, 2023

(86) PCT No.: PCT/CN2023/121353
§ 371 (c)(1),
(2) Date: Dec. 5, 2023

(87) PCT Pub. No.: WO2025/060121
PCT Pub. Date: Mar. 27, 2025

(65) Prior Publication Data

US 2025/0098307 A1 Mar. 20, 2025

(30) Foreign Application Priority Data

Sep. 19, 2023 (CN) ........................ 202311221647.2

(51) Int. Cl.
*H10D 86/60* (2025.01)
*G02F 1/1368* (2006.01)
(Continued)

(52) U.S. Cl.
CPC ........... *H10D 86/60* (2025.01); *G02F 1/1368* (2013.01); *H10D 30/6731* (2025.01);
(Continued)

(58) Field of Classification Search
CPC ............... H10D 86/60; H10D 30/6731; H10D 30/6745; H10D 86/411; H10D 86/421;
(Continued)

(56) References Cited

U.S. PATENT DOCUMENTS 4,737,018 A * 4/1988 Iwashita ............. G02F 1/13439 349/137
2010/0012944 A1* 1/2010 Cho .................. H10D 30/6731 438/151

(Continued)

FOREIGN PATENT DOCUMENTS

CN 110335968 A 10/2019
CN 111063819 A 4/2020

(Continued)

OTHER PUBLICATIONS

International Search Report in International application No. PCT/CN2023/121353, mailed on Jun. 14, 2024.

(Continued)

*Primary Examiner* — Tucker J Wright
(74) *Attorney, Agent, or Firm* — Geoffrey Lottenberg; Berger Singerman LLP

(57) ABSTRACT

An array substrate, a display panel, and a display device are provided. The array substrate includes a base; a buffer layer and a thin film transistor. The buffer layer is provided on the base and includes a first buffer layer and a second buffer (Continued)

layer. The first buffer layer is disposed between the second buffer layer and the base. A refractive index of the first buffer layer is greater than a refractive index of the base and a refractive index of the second buffer layer. A ratio of the refractive index of the first buffer layer to the refractive index of the base is less than or equal to 1.25. The thin film transistor is provided on a side of the buffer layer away from the base.

20 Claims, 3 Drawing Sheets

(51) Int. Cl.
*H10D 30/67* (2025.01)
*H10D 86/40* (2025.01)

(52) U.S. Cl.
CPC ....... *H10D 30/6745* (2025.01); *H10D 86/411* (2025.01); *H10D 86/421* (2025.01)

(58) Field of Classification Search
CPC . H10D 86/0212; G02F 1/1368; G02F 1/1362; G02F 1/0063; G02F 1/133302; G02F 1/1336
See application file for complete search history.

(56) References Cited

U.S. PATENT DOCUMENTS

| | | | | |
|---|---|---|---|---|
| 2012/0098008 A1* | 4/2012 | Song | H10K 59/124 | 257/98 |
| 2013/0169901 A1* | 7/2013 | Kim | G02F 1/13394 | 257/E29.273 |
| 2020/0119311 A1* | 4/2020 | Lim | H10K 59/124 | |
| 2021/0165155 A1 | 6/2021 | Tan et al. | | |
| 2023/0132497 A1* | 5/2023 | Ahn | H10K 50/865 | 257/40 |

FOREIGN PATENT DOCUMENTS

| | | | |
|---|---|---|---|
| CN | 111627929 | A | 9/2020 |
| CN | 114664867 | A | 6/2022 |
| CN | 115172432 | A | 10/2022 |
| CN | 115407570 | A | 11/2022 |
| CN | 220872825 | U | 4/2024 |
| DE | 102022128408 | A1 | 5/2023 |
| JP | 2010184478 | A | 8/2021 |
| KR | 20140140738 | A | 12/2014 |
| KR | 20180008954 | A | 1/2018 |

OTHER PUBLICATIONS

Written Opinion of the International Search Authority in International application No. PCT/CN2023/121353, mailed on Jun. 14, 2024.
German Office Action issued in corresponding German Patent Application No. 11 2023 000 069.7 dated Mar. 20, 2024, pp. 1-7.
Korean Office Action issued in corresponding Korean Patent Application No. 10-2023-7041143 dated Jan. 24, 2025, pp. 1-6.
Chinese Office Action issued in corresponding Chinese Patent Application No. 202311221647.2 dated Jul. 17, 2025, pp. 1-7.
Indian Office Action issued in corresponding Indian Patent Application No. 202317081606 dated May 18, 2026, pp. 1-6.

* cited by examiner

1-Comparative example 1

2-Embodiment 1

3-Embodiment 2

ARRAY SUBSTRATE, DISPLAY PANEL AND DISPLAY DEVICE

CROSS REFERENCE TO RELATED APPLICATIONS

This application is a National Stage of International Application No. PCT/CN2023/121353, filed on Sep. 26, 2023, which claims priority to Chinese Patent Application No. 202311221647.2, filed on Sep. 19, 2023, both of which are incorporated by reference herein.

FIELD

The present disclosure relates to display technologies, and more particularly, to an array substrate, a display panel, and a display device.

BACKGROUND

A Liquid Crystal Display (LCD) generally includes a backlight module and a liquid crystal dimming box. The liquid crystal dimming box includes a thin film transistor (TFT) backplane and a color filter substrate. For a picture displayed by the liquid crystal dimming box, the brightness and the display effect of the picture depend to a large extent on the transmittance of backlight, which is emitted by the backlight module, by the liquid crystal dimming box.

Therefore, how to improve the transmittance of the backlight by the liquid crystal dimming box is a technical problem to be solved.

SUMMARY

According to one or more embodiments of the present disclosure, an array substrate includes:

a base;

a buffer layer provided on the base, the buffer layer including a first buffer layer and a second buffer layer, the first buffer layer being disposed between the second buffer layer and the base, a refractive index of the first buffer layer being greater than a refractive index of the base and a refractive index of the second buffer layer, and a ratio of the refractive index of the first buffer layer to the refractive index of the base being less than or equal to 1.25; and a thin film transistor provided on a side of the buffer layer away from the base.

In one or more embodiments, the ratio of the refractive index of the first buffer layer to the refractive index of the base is greater than or equal to 1.02 and less than or equal to 1.15.

In one or more embodiments, a material of the first buffer layer and a material of the second buffer layer are same.

In one or more embodiments, the refractive index of the second buffer layer is less than the refractive index of the base.

In one or more embodiments, both the material of the first buffer layer and the material of the second buffer layer comprise silicon oxide, and the base comprises a glass base.

In one or more embodiments, the refractive index of the base is greater than or equal to 1.45 and less than or equal to 1.55, the refractive index of the first buffer layer is greater than or equal to 1.5 and less than or equal to 1.7, and the refractive index of the second buffer layer is greater than or equal to 1.4 and less than or equal to 1.55.

In one or more embodiments, a thickness of the first buffer layer is greater than a thickness of the second buffer layer.

In one or more embodiments, the buffer layer further includes:

a third buffer layer provided between the base and the first buffer layer, a material of the third buffer layer and the material of the first buffer layer being same, and a refractive index of the third buffer layer being less than the refractive index of the first buffer layer.

In one or more embodiments, the material of the third buffer layer comprises silicon oxide.

In one or more embodiments, a thickness of the first buffer layer is greater than a thickness of the third buffer layer.

In one or more embodiments, a thickness of the first buffer layer is greater than or equal to 1500 angstroms and less than or equal to 2500 angstroms, and a thickness of the third buffer layer is greater than or equal to 300 angstroms and less than or equal to 600 angstroms.

According to one or more embodiments of the present disclosure, a display panel, including:

an array substrate, including:

a base;

a buffer layer provided on the base, the buffer layer including a first buffer layer and a second buffer layer, the first buffer layer being disposed between the second buffer layer and the base, a refractive index of the first buffer layer being greater than a refractive index of the base and a refractive index of the second buffer layer, and a ratio of the refractive index of the first buffer layer to the refractive index of the base being less than or equal to 1.25; and a thin film transistor provided on a side of the buffer layer away from the base.

According to one or more embodiments of the present disclosure, a display device, including:

a display panel, the display panel including an array substrate, the array substrate including:

a base;

a buffer layer provided on the base, wherein the buffer layer including a first buffer layer and a second buffer layer, the first buffer layer being disposed between the second buffer layer and the base, a refractive index of the first buffer layer being greater than a refractive index of the base and a refractive index of the second buffer layer, and a ratio of the refractive index of the first buffer layer to the refractive index of the base being less than or equal to 1.25; and a thin film transistor provided on a side of the buffer layer away from the base; and a backlight module provided on a back side of a light-emitting side of the display panel.

DETAILED DESCRIPTION

The technical solution in the embodiments of the present disclosure will be clearly and completely described with reference to the accompanying drawings. It will be apparent that the described embodiments are only part of the embodiments of the present disclosure, and not all embodiments. Based on the embodiments in the present disclosure, all other embodiments obtained by those skilled in the art without involving any inventive effort are within the scope of the present disclosure.

Figure 1:
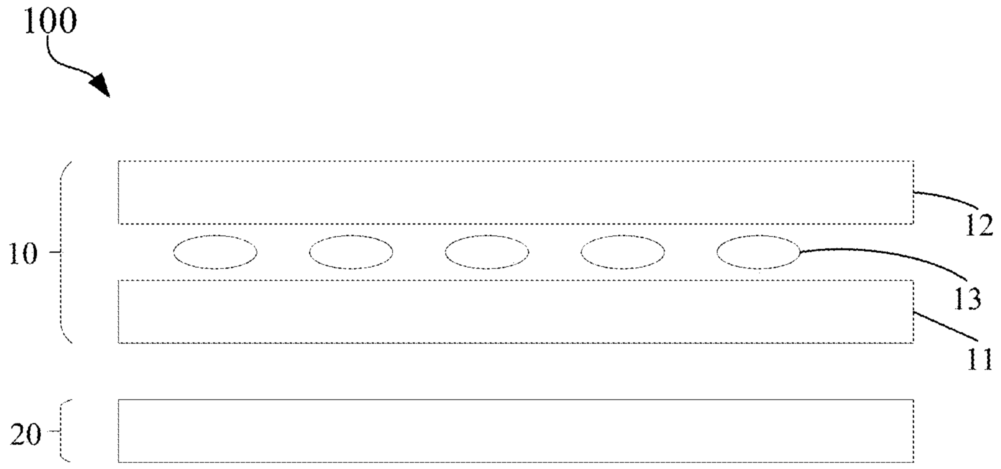
FIG. 1 is a schematic cross-sectional view of a display device according to one or more embodiments of the present disclosure.
Figure 2:
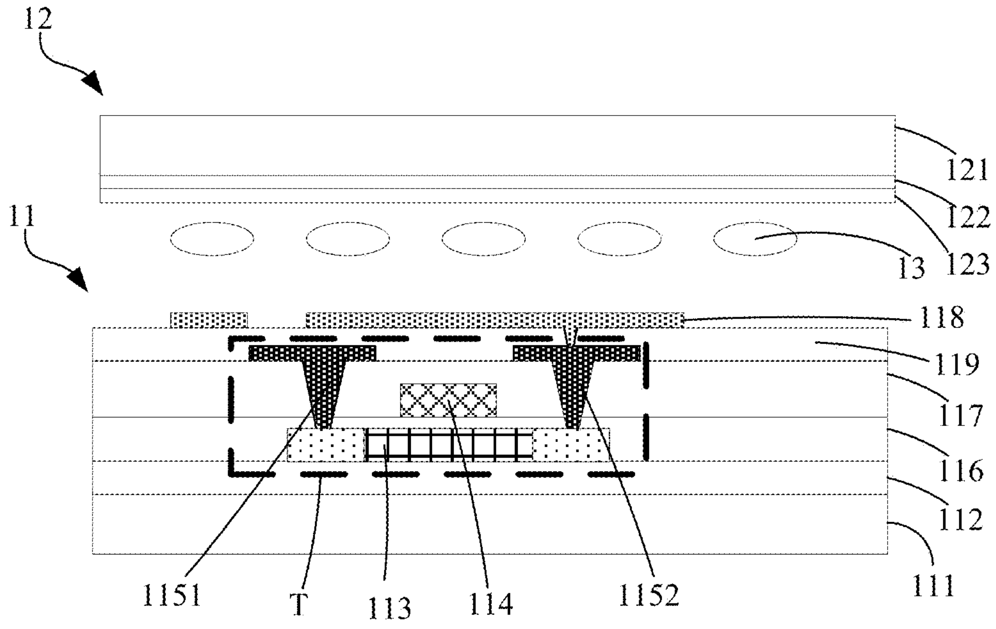
FIG. 2 is a schematic cross-sectional view of a display panel according to one or more embodiments of the present disclosure.

Referring to FIGS. 1 and 2, FIG. 1 is a schematic cross-section view of a display device according to one or more embodiments of the present disclosure, and FIG. 2 is a schematic cross-section view of a display panel according to one or more embodiments of the present disclosure.

As shown in FIG. 1, the display device 100 includes a display panel 10 and a backlight module 20 on a side of the display panel 10 opposite to a light-emitting side of the display panel 10. The display panel 10 may be any one of a Vertical Alignment (VA) liquid crystal display panel, a Fringe Field Switching (FFS) liquid crystal display panel, an In-Plane Switching (IPS) liquid crystal display panel, or a Twisted Nematic (TN) liquid crystal display panel. The backlight module 20 is used to emit backlight. After the backlight passes through the display panel 10, the display device 100 can display.

As shown in FIGS. 1 and 2, the display panel 10 includes an array substrate 11, an opposing substrate 12, and a liquid crystal layer 13. The array substrate 11 is disposed opposite to the opposing substrate 12. The liquid crystal layer 13 is disposed between the array substrate 11 and the opposing substrate 12. The array substrate 11 includes a base 111, a buffer layer 112 on the base 111 and a thin film transistor T. The buffer layer 112 is disposed between the thin film transistor T and the base 111. The opposing substrate 12 includes an opposing base 121 opposite to the base 111.

The base 111 and the opposing base 121 are both light-transmitting to improve the transmittance of the base 111 and the opposing base 121 to the backlight. In one or more embodiments, both the base 111 and the opposing base 121 include a transparent glass base, which is not limited herein. It will be appreciated that both base 111 and opposing base 121 may also include a transparent organic base. The refractive indices of the base 111 and the opposing base 121 are both greater than or equal to 1.45 and less than or equal to 1.55. For example, the refractive indices of the base 111 and the opposing base 121 are 1.45, 1.48, 1.50, 1.51, 1.52, or 1.55.

The thin film transistor T includes a gate 114, an active layer 113, a source 1151, and a drain 1152.

In one or more embodiments, the thin film transistor T includes a top-gate thin film transistor. In a case that the thin film transistor T is a top-gate thin film transistor, the active layer 113 is provided on a surface of the buffer layer 112 away from the base 111. The gate 114 is disposed on a side of the active layer 113 away from the base 111. The source 1151 and the drain 1152 are disposed on a side of the active layer 113 away from the base 111 and are in contact with the active layer 113. A gate insulating layer 116 is provided between the active layer 113 and the gate 114. The gate insulating layer 116 includes a silicon oxide layer. A refractive index of the gate insulating layer 116 is greater than or equal to 1.4 and less than or equal to 1.55. An interlayer insulating layer 117 is provided between the gate 114 and each of the source 1151 and the drain 1152. The interlayer insulating layer 117 includes at least one of a silicon oxide layer or a silicon nitride layer.

In one or more embodiments, the active layer 113 includes at least one of polysilicon, amorphous silicon, monocrystalline silicon, or a metal oxide. In one or more embodiments, the active layer 113 comprises polysilicon.

In one or more embodiments, the thin film transistor T may also include a bottom-gate thin film transistor. In this case, the gate 114 is disposed on the buffer layer 112. The active layer 113 is disposed on a side of the gate 114 away from the base 111. The gate insulating layer 116 is disposed between the active layer 113 and the gate 114. The source 1151 and the drain 1152 are disposed on a side of the active layer 113 away from the base 111 and are in contact with the active layer 113. The interlayer insulating layer 117 may also be disposed between the active layer 113 and each of the source 1151 and the drain 1152.

The buffer layer 112 is disposed on and in direct contact with the base 111. The buffer layer 112 serves to block ions in the base 111, such as Na+, K+, from diffusing into the active layer 113 of the thin film transistor T, so as to improve a problem of threshold voltage drift of the thin film transistor T due to ion diffusion into the thin film transistor T. Since the backlight is incident on the display panel 10, it needs to pass through the array substrate 11, the liquid crystal layer 13, and the opposing substrate 12 before being emitted from the display panel 10. Therefore, the backlight needs to pass through the buffer layer 112, which also affects the transmittance of the display panel 10 to the backlight.

It should be noted that, generally, it has been found through experimental analysis that, larger a refractive index of a film layer, lower an etching rate of the film layer, and higher density of the film layer. Higher the density of the film layer, better barrier performance of the film layer to ions. Moreover, more refractive indices of two adjacent film layers tend to be same, higher transmittances of the two film layers to light. According to one or more embodiments of the present disclosure, the barrier performance of the buffer layer 112 to ions is ensured while the transmittance of the buffer layer 112 to the backlight is improved, thereby improving stability of performance of the thin film transistor T.

Figure 3:
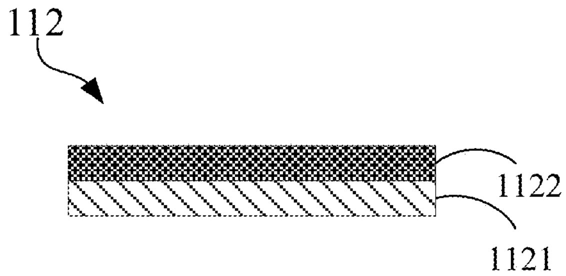
FIG. 3 is a schematic cross-sectional view of a buffer layer according to one or more embodiments of the present disclosure.

FIG. 3 shows a schematic cross-section view of a buffer layer according to one or more embodiments of the present disclosure. The buffer layer 112 includes a first buffer layer 1121 and a second buffer layer 1122. The first buffer layer 1121 is disposed between the second buffer layer 1122 and the base 111.

The first buffer layer 1121 acts as a barrier against the diffusion of ions in the base 111 into the active layer 113 of the thin film transistor T. The first buffer layer 1121 is denser than the second buffer layer 1122. Accordingly, the etching rate of the first buffer layer 1121 is lower than the etching rate of the second buffer layer 1122.

The second buffer layer 1122 acts as thermal insulation to ensure better crystallization of the active layer 113. Thus, the performance of the thin film transistor T is more stable.

A refractive index of the first buffer layer 1121 is greater than a refractive index of the base 111 and a refractive index of the second buffer layer 1122. A ratio of the refractive index of the first buffer layer 1121 to the refractive index of the base 111 is less than or equal to 1.25. By such a configuration, the ratio of the refractive index of the first buffer layer 1121 to the refractive index of the base 111 is small, the refractive index of the first buffer layer 1121 is similar to the refractive index of the base 111, and the refractive index of the first buffer layer 1121 is greater than the refractive index of the second buffer layer 1122. A transmittance of the base 111 to the backlight, a transmittance of the first buffer layer 1121 to the backlight, and a transmittance of the second buffer layer 1122 to the backlight are all great, thereby improving the transmittance of the array substrate 11 to the backlight. Moreover, the refractive index of the first buffer layer 1121 is greater than the refractive index of the base 111, and the first buffer layer 1121 is denser than the base 111. The first buffer layer 1121 has a good barrier performance to ions in the base 111, thereby improving a problem of stability of the thin film transistor T due to diffusion of ions to the thin film transistor T.

Therefore, by the above-described buffer layer 112, the array substrate 11 according to the present disclosure can balance the transmittance to the backlight and the stability of the thin film transistor, thereby improving the transmittance of the display panel 10 to the backlight, improving operation stability of the display panel 10, and improving the display effect of the display device 100.

In one or more embodiments, the ratio of the refractive index of the first buffer layer 1121 to the refractive index of the base 111 is greater than or equal to 1.02 and less than or equal to 1.15. By such a configuration, the first buffer layer 1121 has a greater refractive index, and the first buffer layer 1121 has a higher density. The first buffer layer 1121 has a better barrier performance to ions in the base 111, further improving a problem of the stability of the thin film transistor T due to diffusion of ions of the thin film transistor T. Moreover, the ratio of the refractive index of the first buffer layer 1121 to the refractive index of the base 111 is small, the transmittance of the base 111 to the backlight and the transmittance of the first buffer layer 1121 to the backlight are higher, and the transmittance of the array substrate 11 to the backlight is further improved.

Alternatively, the ratio of the refractive index of the first buffer layer 1121 to the refractive index of the base 111 is greater than or equal to 1.03 and less than or equal to 1.18. Alternatively, the ratio of the refractive index of the first buffer layer 1121 to the refractive index of the base 111 is greater than or equal to 1.05 and less than or equal to 1.15. Alternatively, the ratio of the refractive index of the first buffer layer 1121 to the refractive index of the base 111 is greater than or equal to 1.08 and less than or equal to 1.12.

In one or more embodiments, the first buffer layer 1121 and the second buffer layer 1122 are made of a same material. By such a configuration, in a case that the refractive index of the first buffer layer 1121 is greater than the refractive index of the second buffer layer 1122, a difference between the refractive index of the first buffer layer 1121 and the refractive index of the second buffer layer 1122 is reduced, and the refractive index of the first buffer layer 1121 is similar to the refractive index of the second buffer layer 1122, thereby improving the transmittance of the buffer layer 112 to the backlight and further improving the transmittance of the array substrate 11 to the backlight. In a case that the first buffer layer 1121 and the second buffer layer 1122 are made of a same material, formation conditions of the first buffer layer 1121 and the second buffer layer 1122 are controlled, so that the first buffer layer 1121 and the second buffer layer 1122 can be continuously formed, thereby simplifying a process for manufacturing the array substrate 11.

In one or more embodiments, in a case that the first buffer layer 1121 and the second buffer layer 1122 are made of a same material, the refractive index of the first buffer layer 1121 is greater than the refractive index of the second buffer layer 1122. By such a configuration, the first buffer layer 1121 is denser than the second buffer layer 1122, and the first buffer layer 1121 has a better barrier performance to ions in the base 111. The second buffer layer 1122 is relatively sparse and is less difficult to manufacture.

In one or more embodiments, in a case that the first buffer layer 1121 is denser than the second buffer layer 1122, the first buffer layer 1121 may be formed by at least one of chemical vapor deposition or atomic deposition to produce a dense first buffer layer 1121. The second buffer layer 1122 may be formed by chemical vapor deposition. In one or more embodiments, both the first buffer layer 1121 and the second buffer layer 1122 are formed by chemical vapor deposition to facilitate continuous preparation of the first buffer layer 1121 and the second buffer layer 1122, thereby simplifying the manufacturing process of the array substrate 11.

In one or more embodiments, a difference between the refractive index of the first buffer layer 1121 and the refractive index of the second buffer layer 1122 is greater than 0 and less than or equal to 0.35. Thus, the difference between the refractive index of the first buffer layer 1121 and the refractive index of the second buffer layer 1122 is small, so that the transmittance of the buffer layer 112 to the backlight is further improved, and the transmittance of the array substrate 11 to the backlight is further improved. Alternatively, the difference between the refractive index of the first buffer layer 1121 and the refractive index of the second buffer layer 1122 is greater than 0.05 and less than or equal to 0.3. Alternatively, the difference between the refractive index of the first buffer layer 1121 and the refractive index of the second buffer layer 1122 is greater than 0.08 and less than or equal to 0.2. Alternatively, the difference between the refractive index of the first buffer layer 1121 and the refractive index of the second buffer layer 1122 is greater than 0.09 and less than or equal to 0.15.

In one or more embodiments, the refractive index of the second buffer layer 1122 is less than the refractive index of the base 111. Thus, the second buffer layer 1122 can be prepared by a conventional process, thereby reducing manufacturing difficulty of the second buffer layer 1122.

In one or more embodiments, the first buffer layer 1121 has a refractive index greater than or equal to 1.5 and less than or equal to 1.7. Alternatively, the first buffer layer 1121 has a refractive index greater than or equal to 1.52 and less than or equal to 1.65. Alternatively, the first buffer layer 1121 has a refractive index greater than or equal to 1.55 or more and less than or equal to 1.6 or.

In one or more embodiments, the second buffer layer 1122 has a refractive index greater than or equal to 1.4 and less than or equal to 1.55. Alternatively, the second buffer layer 1122 has a refractive index greater than or equal to 1.42 and less than or equal to 1.52. Alternatively, the second buffer layer 1122 has a refractive index greater than or equal to 1.45 and less than or equal to 1.5.

In one or more embodiments, both a material of the first buffer layer 1121 and a material of the second buffer layer 1122 include silicon oxide, that is, both the first buffer layer 1121 and the second buffer layer 1122 include a silicon oxide layer, which is not limited herein. Thus, the buffer layer 112 employs a double-layer silicon oxide structure. Refractive indices of the first buffer layer 1121 and the second buffer layer 1122 tend to be same as the refractive index of the base 111, thereby facilitating improvement of the transmittance of the array substrate 11 to the backlight. Also, the material of the second buffer layer 1122 includes silicon oxide. The second buffer layer 1122 has a good thermal insulating performance to facilitate crystallization of the active layer 113 under the thermal insulating effect of the second buffer layer 1122. It will be appreciated that the materials of the first buffer layer 1121 and the second buffer layer 1122 may also be other materials other than silicon oxide, as long as the above requirements for refractive index and thermal insulation are satisfied.

It should be noted that in the related art, in a case that the buffer layer includes a silicon nitride layer, transmittance of the silicon nitride layer to light is approximately 98.5%. In one or more embodiments of the present disclosure, in a case that the buffer layer 112 includes the first buffer layer 1121, the light transmittance of the first buffer layer 1121 to light is about 99.99%. Therefore, the first buffer layer 1121, which has a great refractive index and high density, can not only significantly improve the transmittance of the buffer layer 112 to light, but also have a good barrier performance to ions. Both the first buffer layer 1121 and the second buffer layer 1122 include a silicon oxide layer, and the refractive index of the first buffer layer 1121 is greater than the refractive index of the second buffer layer 1122. By such a configuration, the transmittance of the buffer layer 112 to the backlight can be significantly improved, a good barrier performance to ions in the base 111 is ensured, and it is ensured that the active layer 113 can be better crystallized.

In one or more embodiments, a thickness of the first buffer layer 1121 is greater than a thickness of the second buffer layer 1122. Thus, the thickness of the first buffer layer 1121 is greater, and the first buffer layer 1121 has a better barrier performance to ions in the base 111, thereby further improving a problem of stability of the thin film transistor T due to diffusion of ions in the base 111 to the thin film transistor T.

In one or more embodiments, the thickness of the first buffer layer 1121 is greater than or equal to 1500 angstroms and less than or equal to 2500 angstroms. Alternatively, the first buffer layer 1121 has a thickness greater than or equal to 1600 angstroms and less than or equal to 2200 angstroms. Alternatively, the thickness of the first buffer layer 1121 is greater than or equal to 1800 angstroms and less than or equal to 2100 angstroms. In a case that the first buffer layer 1121 is too thin, it is not conducive to improving the barrier performance of the buffer layer 112. In a case that the first buffer layer 1121 is too thick, the manufacturing difficulty of the first buffer layer 1121 is increased.

In one or more embodiments, the thickness of the second buffer layer 1122 is greater than or equal to 300 angstroms and less than or equal to 1200 angstroms. Alternatively, the thickness of the second buffer layer 1122 is greater than or equal to 400 angstroms and less than or equal to 1000 angstroms. Alternatively, the thickness of the second buffer layer 1122 is greater than or equal to 450 angstroms and less than or equal to 800 angstroms. In a case that the second buffer layer 1122 is too thin, it is no conductive to ensuring the thermal insulation performance of the second buffer layer 1122. In a case that the second buffer layer 1122 is too thick, a time length for manufacturing the second buffer layer 1122 is increased.

The array substrate 11 further includes a pixel electrode 118 connected to the drain 1152 of the thin film transistor T. The pixel electrode 118 is provided at a side of the source 1151 and the drain 1152 away from the base 111, and a passivation layer 119 is provided between the pixel electrode 118 and each of the source 1151 and the drain 1152. A material of the pixel electrode 118 includes a transparent conductive material. A material of the passivation layer 119 includes at least one of silicon oxide, silicon nitride, or silicon oxynitride.

The opposing substrate 12 also includes a filter layer 122 and a common electrode layer 123. In one or more embodiments, the filter layer 122 is disposed on a surface of the opposing base 121 close to the base 111, and the filter layer 122 is disposed between the common electrode layer 123 and the opposing base 121. The filter layer 122 includes a color filter layer and a black matrix layer. The color filter layer includes multiple color resistance units of different colors. The black matrix layer includes multiple openings, and multiple color resistance units are disposed in the multiple openings, respectively. In one or more embodiments, both the filter layer 122 and the common electrode layer 123 may be disposed on the array substrate 11.

Figure 4:
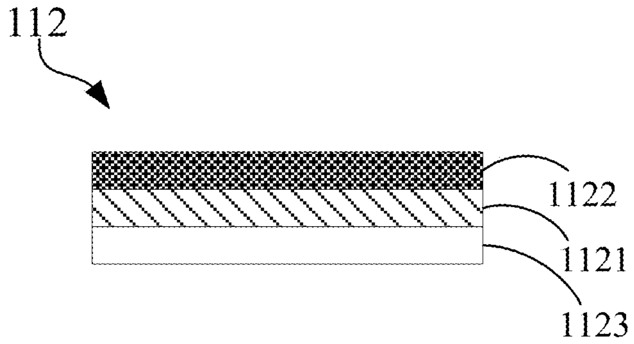
FIG. 4 is a schematic cross-sectional view of a buffer layer according to one or more other embodiments of the present disclosure.

FIG. 4 is a schematic cross-section view of a buffer layer according to one or more embodiments of the present disclosure. The buffer layer 112 shown in FIG. 4 is basically similar to the buffer layer 112 shown in FIG. 3. A difference is that the buffer layer 112 further includes a third buffer layer 1123. The third buffer layer 1123 is disposed between the base 111 and the first buffer layer 1121. The third buffer layer 1123 and the first buffer layer 1121 are made of a same material, and a refractive index of the third buffer layer 1123 is smaller than the refractive index of the first buffer layer 1121. Therefore, the buffer layer 112 includes a three-layer structure, and the first buffer layer 1121 having a greater refractive index is sandwiched between two buffer layers having a less refractive index, the third buffer layers 1123 and the second buffer layer 1122.

In one or more embodiments of the present disclosure, based on that the buffer layer 112 includes the first buffer layer 1121 and the second buffer layer 1122, the third buffer layer 1123 is added between the first buffer layer 1121 and the base 111, the third buffer layer 1123 and the first buffer layer 1121 are made of a same material, and the refractive index of the third buffer layer 1123 is less than the refractive index of the first buffer layer 1121. By such a configuration, the third buffer layer 1123 having a relatively small refractive index may be formed first, and then the first buffer layer 1121 having a relatively large refractive index may be formed. A load of the film forming device is adjusted to a film forming condition corresponding to the third buffer layer 1123, and then is adjusted to a film forming condition of the first buffer layer 1121, so that the load of the film forming device can be more easily controlled, thereby improving stability of the device for manufacturing the first buffer layer 1121. Therefore, the performance of the first buffer layer 1121 having a greater refractive index manufactured by the device is more controllable, the first buffer layer 1121 has a better barrier performance, and a problem of the stability of the first buffer layer 1121 due to ion diffusion to the thin film transistor T is further improved.

It should be noted that the first buffer layer 1121 is a film layer having a relatively high density and is difficult to manufacture. When the first buffer layer 1121 is formed, if the load of the device for manufacturing the first buffer layer 1121 is directly adjusted to the film forming condition corresponding to the first buffer layer 1121, the load of the apparatus is difficult to manage. A third buffer layer 1123 is provided between the first buffer layer 1121 and the base 111, the third buffer layer 1123 and the first buffer layer 1121 are made of a same material, and the refractive index of the third buffer layer 1123 is less than the refractive index of the first buffer layer 1121. By such a configuration, the load of the device for manufacturing the first buffer layer 1121 can be gradually increased, the film forming load of the device can be effectively improved, stability of a production line device can be effectively improved, and the performance of the thin film transistor T can be improved.

In one or more embodiments, the thickness of the first buffer layer 1121 is greater than the thickness of the third buffer layer 1123. By such a configuration, the thickness of the first buffer layer 1121 is greater, and the first buffer layer 1121 has a better barrier performance to ions in the base 111, further improving a problem of the stability of the thin film transistor T due to diffusion of ions in the base 111 to the thin film transistor T. Further, the thickness of the third buffer layer 1123 is small, and the manufacturing time of the third buffer layer 1123 is shortened.

In one or more embodiments, the thickness of the third buffer layer 1123 is greater than or equal to 300 angstroms and less than or equal to 600 angstroms. Alternatively, the thickness of the third buffer layer 1123 is greater than or equal to 400 angstroms and less than or equal to 550 angstroms. Alternatively, the thickness of the third buffer layer 1123 is greater than or equal to 450 angstroms and less than or equal to 520 angstroms. In a case that the third buffer layer 1123 is too thin, it is not constructive to a gradual increase of the load of the device. In a case that the second buffer layer 1122 is too thick, the time for manufacturing the third buffer layer 1123 is too long, and the display panel 100 is too thick.

In one or more embodiments, the material of the third buffer layer 1123 includes silicon oxide, i.e., the third buffer layer 1123 also includes a silicon oxide layer. The third buffer layer 1123 has a refractive index greater than or equal to 1.4 and less than or equal to 1.55. Alternatively, the third buffer layer 1123 has a refractive index greater than or equal to 1.42 and less than or equal to 1.52. Alternatively, the third buffer layer 1123 has a refractive index greater than or equal to 1.45 and less than or equal to 1.5.

In one or more embodiments, the refractive index of the third buffer layer 1123 may be same as the refractive index of the second buffer layer 1122. In one or more embodiments, the thickness of the third buffer layer 1123 may be same as the thickness of the second buffer layer 1122.

In one or more embodiments, the refractive index of the third buffer layer 1123 is same as the refractive index of the second buffer layer 1122. Thus, the third buffer layer 1123 and the second buffer layer 1122 may be formed under a same condition, thereby simplifying the manufacturing process of the array substrate 11. In one or more embodiments, the refractive index of the third buffer layer 1123 may also be different from the refractive index of the second buffer layer 1122. For example, the refractive index of the third buffer layer 1123 may also be greater than the refractive index of the second buffer layer 1122, so that the density of the third buffer layer 1123 is higher than the density of the second buffer layer 1122, further improving the barrier performance of the buffer layer 112.

In one or more embodiments, the first buffer layer 1121, the second buffer layer 1122, and the third buffer layer 1123 all include a silicon oxide layer. The refractive index of the first buffer layer 1121 is greater than the refractive index of the second buffer layer 1122 and the refractive index of the third buffer layer 1123, and correspondingly, the density of the first buffer layer 1121 is greater than the density of the second buffer layer 1122 and the density of the third buffer layer 1123. Therefore, the buffer layer 112 includes three silicon oxide layers, the refractive index of the third buffer layer 1123 is similar to the refractive index of the base 111, the first buffer layer 1121 has a great density and a great refractive index, and the second buffer layer 1122 has a small refractive index.

In one or more embodiments, the buffer layer 112 further includes a fourth buffer layer provided between the third buffer layer 1123 and the base 111, the fourth buffer layer and the third buffer layer 1123 are made of a same material, and the refractive index of the fourth buffer layer is less than the refractive index of the third buffer layer 1123. By such a configuration, the load of the device for manufacturing the first buffer layer 1121 is gradually increased, so that the film forming load of the device can be effectively improved, the stability of the production line device can be effectively improved, and the performance of the thin film transistor T can be improved. In one or more embodiments, the fourth buffer layer includes a silicon oxide layer.

It will be appreciated that, based on the refractive index of the first buffer layer 1121, the third buffer layer 1123 and the fourth buffer layer may be provided, or two or more silicon oxide layers may be provided. In a direction of the base 111 pointing towards the first buffer layer 1121, the refractive index of each of silicon oxide layers between the first buffer layer 1121 and the base 111 increases.

Figure 6:
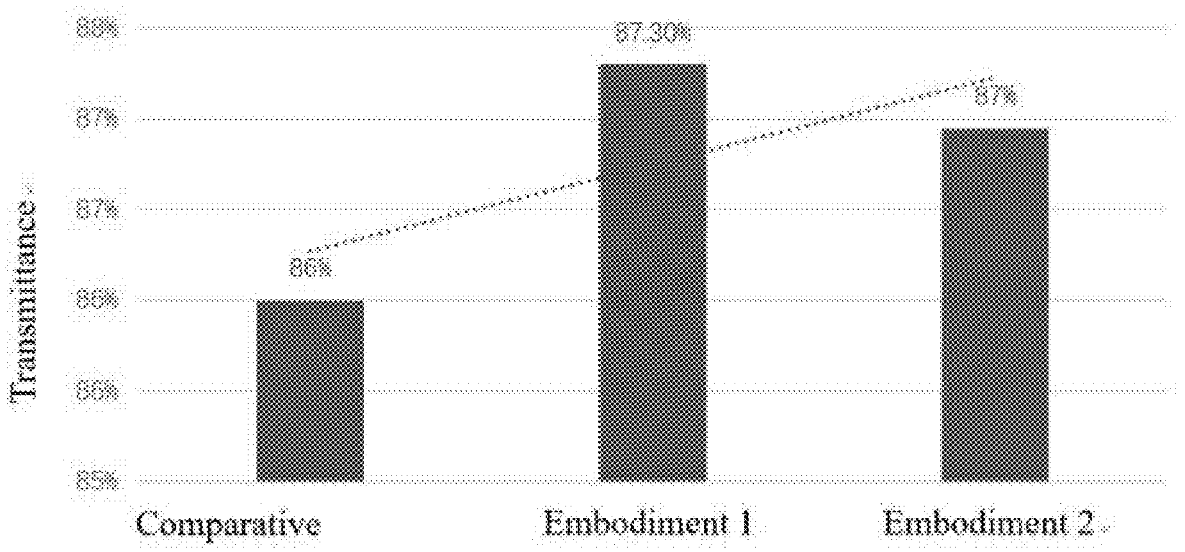
FIG. 6 shows a test result of transmittance of the backlight by an array substrate shown in FIG. 2 when each of the respective buffer layers of Comparative example 1, Embodiment 1 and Embodiment 2 is used as a buffer layer of the array substrate.
Figure 7:
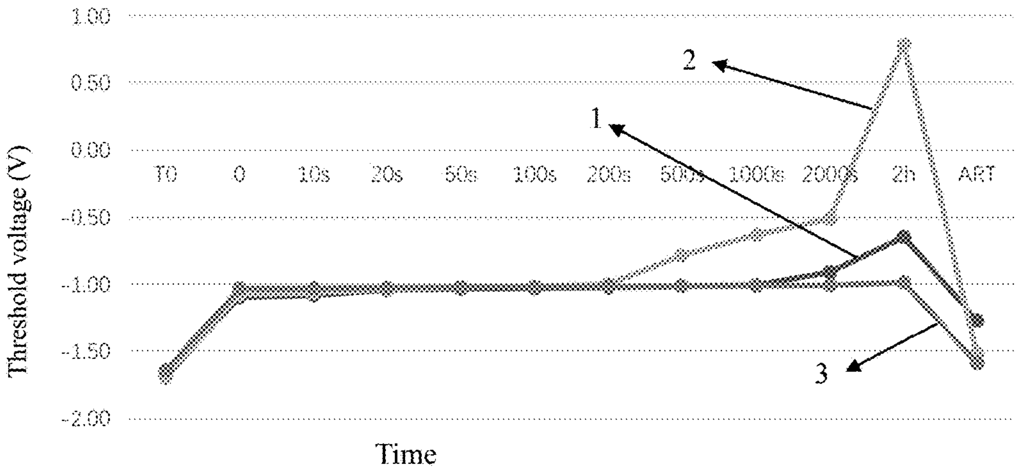
FIG. 7 shows a test result of a threshold voltage of a thin film transistor, to which a bias voltage is applied, changing over time when each of the respective buffer layers of Comparative example 1, Embodiment 1 and Embodiment 2 is used as the buffer layer of the array substrate shown in FIG. 2.

Following Table 1, FIGS. 6-7 are a test result of the transmittance of the array substrate to the backlight and a threshold voltage of a thin film transistor changing over time when buffer layers of embodiment 1, embodiment 2, and comparative example 1 are respectively applied to the buffer layer of the array substrate shown in FIG. 2.

In embodiment 1, the buffer layer employs above-described double-layer silicon oxide structure. The buffer layer includes a first buffer layer 1121 and a second buffer layer 1122, and the first buffer layer 1121 is disposed between the base 111 and the second buffer layer 1122. The first buffer layer 1121 is a dense silicon oxide layer, and the refractive index of the first buffer layer 1121 is 1.57. The second buffer layer 1122 is a sparse silicon oxide layer, and the refractive index of the second buffer layer 1122 is 1.45. The refractive index of the base was 1.51.

In Embodiment 2, the buffer layer employs a three-layer silicon oxide structure. The buffer layer includes the first buffer layer 1121, the second buffer layer 1122, and the third buffer layer 1123. The first buffer layer 1121 is disposed between the second buffer layer 1122 and the third buffer layer 1123. The third buffer layer 1123 is disposed between the base 111 and the first buffer layer 1121. The second buffer layer 1122 is disposed on a side of the first buffer layer 1121 away from the base 111. The first buffer layer 1121 is a dense silicon oxide layer, and the refractive index of the first buffer layer 1121 is 1.57. The second buffer layer 1122 is also a silicon oxide layer, and the refractive index of the second buffer layer 1122 is 1.45. The refractive index of the base is 1.51. The third buffer layer 1123 is also a silicon oxide layer, and the refractive index of the third buffer layer 1123 is 1.45.

Figure 5:
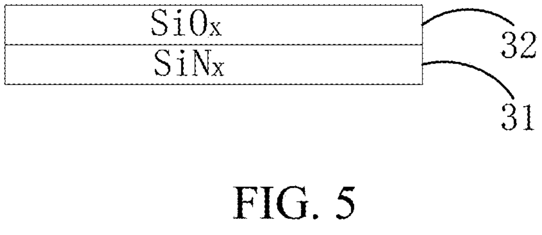
FIG. 5 is a schematic cross-sectional view of a buffer layer of Comparative example 1.

In comparative example 1, the buffer layer includes a silicon nitride layer 31 and a silicon oxide layer 32. As shown in FIG. 5, the silicon nitride layer 31 is disposed between the base 111 and the silicon oxide layer 32. The refractive index of the silicon nitride layer 31 is 1.92, the refractive index of the base is 1.51, and the refractive index of the silicon oxide layer is 1.45.

In addition, a test result of the threshold voltage of the thin film transistor changing over time is a drift characteristic curve obtained when a Bias stress (BS) is applied to the gate and the source of the thin film transistor. A threshold voltage drift value is equal to a difference between a threshold voltage of the thin film transistor at time of 2 h and a threshold voltage at time of 0s.

| | Transmittance | Threshold voltage drift value |
|---|---|---|
| Embodiment 1 | 87.3% | 1.86 V |
| Embodiment 2 | 87% | 0.05 V |
| Comparative example 1 | 86% | 0.45 V |

Table 1 a test result of the transmittance and the threshold voltage drift value of embodiment 1, embodiment 2, and comparative example 1

As can be seen from Table 1, compared with comparative example 1, the buffer layers of Embodiment 1 and Embodiment 2 of the present disclosure are designed so that the transmittance of the array substrate to the backlight is increased by at least 1%. After test and verification, in a case that the transmittance is increased by at least 1% during display of the display device, display brightness of the display device can be increased by at least 7%. Therefore, by increasing the transmittance of the array substrate to the backlight, the display effect of the display device can be significantly improved.

In addition, compared with comparative example 1, using the buffer layer according to Embodiment 2 of the present disclosure, under the action of a vertical electric field (an electric field generated by gate loaded bias) and a horizontal electric field (an electric field generated by source loaded bias), a problem that the threshold voltage of the thin film transistor drifts over time is significantly improved. Moreover, compared with Embodiment 1, the buffer layer in Embodiment 2 employs a three-layer silicon oxide structure, and the threshold voltage of the thin film transistor is significantly improved.

Therefore, in related art, the design of the buffer layer only takes into account its barrier properties but ignores its influence on the display brightness of the display device. According to the technical solution of the present disclosure, the improvement of the film layer of the buffer layer ensures that the stability of the thin film transistor can be improved while the transmittance of the backlight through the display panel is increased, transmittance to backlight and device stability are balanced, and the display effect of the display device is improved.

It should be noted that the array substrate 11 may be applied to other display panels, such as an organic light-emitting diode display panel, a sub-millimeter light-emitting diode display panel, a micro light-emitting diode display panel, and a quantum dot display panel. The above-mentioned design of the array substrate 11 may also be applied to a spliced display panel. When applied to the display panel, the array substrate 11 includes at least a base 111, a buffer layer 112, and a thin film transistor T.

The above description of the embodiments is merely intended to assist in understanding the technical solution of the present disclosure and the core concepts thereof. It will be appreciated by those skilled in the art that modifications may still be made to the technical solutions described in the foregoing embodiments, or equivalent substitutions may be made to some of the technical features therein. These modifications or substitutions do not depart the essence of the corresponding technical solutions from the scope of the technical solutions of the embodiments of the present disclosure.

What is claimed is:

1. An array substrate, comprising:

a base;

a buffer layer provided on the base, wherein the buffer layer comprises a first buffer layer and a second buffer layer, the first buffer layer is disposed between the second buffer layer and the base, a refractive index of the first buffer layer is greater than or equal to 1.5 and less than or equal to 1.7, the refractive index of the first buffer layer is greater than a refractive index of the base and a refractive index of the second buffer layer, and a ratio of the refractive index of the first buffer layer to the refractive index of the base is less than or equal to 1.25; and a thin film transistor provided on a side of the buffer layer away from the base.

2. The array substrate according to claim 1, wherein the ratio of the refractive index of the first buffer layer to the refractive index of the base is greater than or equal to 1.02 and less than or equal to 1.15.

3. The array substrate according to claim 1, wherein the first buffer layer comprises a same material as the second buffer layer.

4. The array substrate according to claim 1, wherein the refractive index of the second buffer layer is less than the refractive index of the base.

5. The array substrate according to claim 1, wherein each of the first buffer layer and the second buffer layer comprises silicon oxide, and the base comprises a glass base.

6. The array substrate according to claim 1, wherein the refractive index of the base is greater than or equal to 1.45 and less than or equal to 1.55, and the refractive index of the second buffer layer is greater than or equal to 1.4 and less than or equal to 1.55.

7. The array substrate according to claim 1, wherein a thickness of the first buffer layer is greater than a thickness of the second buffer layer.

8. The array substrate according to claim 1, wherein the buffer layer further comprises:

a third buffer layer provided between the base and the first buffer layer, and wherein the third buffer layer comprises a same material as the first buffer layer, and a refractive index of the third buffer layer is less than the refractive index of the first buffer layer.

9. The array substrate according to claim 8, wherein the third buffer layer comprises silicon oxide.

10. The array substrate according to claim 8, wherein a thickness of the first buffer layer is greater than a thickness of the third buffer layer.

11. The array substrate according to claim 8, wherein a thickness of the first buffer layer is greater than or equal to 1500 angstroms and less than or equal to 2500 angstroms, and a thickness of the third buffer layer is greater than or equal to 300 angstroms and less than or equal to 600 angstroms.

12. A display panel, comprising an array substrate, wherein the array substrate comprises:

a base;

a buffer layer provided on the base, wherein the buffer layer comprises a first buffer layer and a second buffer layer, the first buffer layer is disposed between the second buffer layer and the base, a refractive index of the first buffer layer is greater than or equal to 1.5 and less than or equal to 1.7, the refractive index of the first buffer layer is greater than a refractive index of the base and a refractive index of the second buffer layer, and a ratio of the refractive index of the first buffer layer to the refractive index of the base is less than or equal to 1.25; and a thin film transistor provided on a side of the buffer layer away from the base.

13. The display panel according to claim 12, wherein the ratio of the refractive index of the first buffer layer to the refractive index of the base is greater than or equal to 1.02 and less than or equal to 1.15.

14. The display panel according to claim 12, wherein the first buffer layer comprises a same material as the second buffer layer.

15. The display panel according to claim 12, wherein the refractive index of the second buffer layer is less than the refractive index of the base.

16. The display panel according to claim 12, wherein each of the first buffer layer and the second buffer layer comprises silicon oxide, and the base comprises a glass base.

17. The display panel according to claim 12, wherein the refractive index of the base is greater than or equal to 1.45 and less than or equal to 1.55, and the refractive index of the second buffer layer is greater than or equal to 1.4 and less than or equal to 1.55; and a thickness of the first buffer layer is greater than a thickness of the second buffer layer.

18. The display panel according to claim 12, wherein the buffer layer further comprises:

a third buffer layer provided between the base and the first buffer layer, and wherein the third buffer layer comprises a same material as the first buffer layer, and a refractive index of the third buffer layer is less than the refractive index of the first buffer layer.

19. The display panel according to claim 18, wherein the third buffer layer comprises silicon oxide.

20. A display device, comprising:

a display panel comprising an array substrate; and a backlight module provided on a side of the display panel opposite to a light-emitting side of the display panel, wherein the array substrate comprises:

a base;

a buffer layer provided on the base, wherein the buffer layer comprises a first buffer layer and a second buffer layer, the first buffer layer is disposed between the second buffer layer and the base, a refractive index of the first buffer layer is greater than or equal to 1.5 and less than or equal to 1.7, the refractive index of the first buffer layer is greater than a refractive index of the base and a refractive index of the second buffer layer, and a ratio of the refractive index of the first buffer layer to the refractive index of the base is less than or equal to 1.25; and a thin film transistor provided on a side of the buffer layer away from the base.

* * * * *